United States Patent [19]

Hashiguchi

[11] Patent Number: 5,820,389

[45] Date of Patent: Oct. 13, 1998

[54] CONTACT SET HAVING A WIPING ACTION FOR PRINTED CIRCUIT BOARD

[75] Inventor: Osamu Hashiguchi, Tokyo, Japan

[73] Assignee: Japan Aviation Electronics Industry, Limited, Tokyo, Japan

[21] Appl. No.: 805,675

[22] Filed: Feb. 27, 1997

[51] Int. Cl.[6] .................................................. H01R 9/09
[52] U.S. Cl. ............................................................ 439/66
[58] Field of Search .............................. 439/66, 71, 91, 439/591

[56] References Cited

U.S. PATENT DOCUMENTS

| | | | |
|---|---|---|---|
| 4,553,192 | 11/1985 | Babuka et al. | 439/66 |
| 4,828,515 | 5/1989 | Senor et al. | 439/862 |
| 5,230,632 | 7/1993 | Baumberger et al. | 439/591 |
| 5,342,205 | 8/1994 | Hashiguchi | 439/591 |
| 5,437,556 | 8/1995 | Bargain et al. | 439/66 |

OTHER PUBLICATIONS

Japanese Utility Model Publication (B) No. 13191/1995.

Primary Examiner—Neil Abrams
Assistant Examiner—Barry M. L. Standig
Attorney, Agent, or Firm—Laff, Whitesel, Conte & Saret, Ltd.

[57] ABSTRACT

In an electrical connector mounted onto a printed board for electrically connecting contact pads of LSI circuit and contact pads of the printed board, a plurality of generally U-shaped contacts are held in contact holes in an insulator of the connector. Each contact has a bridge portion connecting both legs of "U" and projecting out of the contact hole above the insulator, and an extension portion obliquely extending from one end of a leg of the "U" and protruding the contact hole below the insulator. The projecting portion of the bridge portion has a contact point for the contact pad of the LSI circuit and the extension portion has a contact point at extending end portion for a contact point of the printed board. Thus, the contact pad of the LSI circuit and the contact pad of the printed board are connected through a relatively short signal path defined by the leg and the extension portion of the contact which is slightly larger than the thickness of the insulator, so that the reliability of the electrical connection is graded up for a high frequency band. Further, the contact points slide on the contact pads, respectively, when the connector with the lSI circuit is mounted on the printed board, thus performing to effectively wipe out contamination from the contact points and contact pads.

3 Claims, 7 Drawing Sheets

CONTACT SET HAVING A WIPING ACTION FOR PRINTED CIRCUIT BOARD

BACKGROUND OF THE INVENTION

This invention relates to an electrical connector (which will be often referred to as "connector" simply, hereinafter) to be interposed between two electronic parts or components, such as a printed circuit board and an LSI (Large Scale Integration) circuit, each of which has contact pads for electrical connection with another electronic part.

For example, a conventional connector of the type described is disclosed in Japanese Utility Model Publication (B) No. 13191/1995. The conventional connector comprises an insulator having a predetermined thickness and provided with a plurality of contact receptacle holes penetrating the insulator in a thickness direction, and a plurality of contacts having an elasticity and inserted into and held in the contact receptacle holes, respectively. The connector is arranged between electronic components, for example, between a printed board and an LSI (Large Scale Integrated) circuit. Then, the printed board and the LSI circuit are applied with a pressing force to clamp and press the insulator therebetween. As a result, the printed board and the LSI circuit are electrically connected via the contacts.

To acquire a sufficient contact pressure to the contact pad of each electronic component by a sufficient elasticity of the contact, those contacts used in the conventional connector of the type are complicated in shape and long in length. For example, W-shaped contacts are frequently used.

However, such a contact long in length and complicated in shape inevitably has a long signal path. The long signal path deteriorates a high-frequency characteristic of the conventional connector. In addition, the contacts of a complicated shape bring about an increase in production cost and a difficulty in fitting the contacts into the insulator.

On the other hand, the surface of each contact or the contact pad often suffers from an undesired insulating film generated thereon due to contamination and/or oxidation of the contact metal for a long use. The undesired film interferes the electrical connection. The undesired film can be removed by frictional slide of the contact on the contact pad when each contact is brought into press contact with the contact pad of the electronic component. The removal of the undesired film by the frictional slide is referred to as a wiping effect. However, the wiping effect is insufficient in the conventional connector using the W-shaped contact because of its structure. In this event, the conventional connector is not insured in reliability of the electrical connection during a long use.

SUMMARY OF THE INVENTION

It is therefore an object of this invention to provide a connector excellent in high-frequency characteristic by the use of a contact having a simple structure and a short signal path.

It is another object of this invention to provide a connector capable of achieving reliable electrical connection for a long use by the use of a contact having a simple structure but exhibiting a sufficient elasticity.

It is still another object of this invention to provide a connector low in production cost and easy in fitting a contact into an insulator.

An electrical connector to which this invention is applicable is for electrical connection between first and second electronic components having contact pads. The connector comprises an insulator having a predetermined thickness and provided with a plurality of contact receptacle holes penetrating the insulator in a thickness direction, and a plurality of contacts having an elasticity and inserted into and held in the contact receptacle holes, respectively. According to this invention, each of the contacts comprises first and second leg portions, a bridge portion connecting the first and the second leg portions and forming a generally U-shaped section in combination with the first and the second leg portions, and an extension portion having one end connected to a first leg end of the first leg portion and obliquely extending from the one end towards the other end. The first and the second leg portions have first and second end portions as supported portions held by an inner wall surface of the contact receptacle hole, respectively. The extension portion has a first contact point formed at the other end to be brought into contact with the contact pad of the first electronic component. The bridge portion has a second contact point to be brought into contact with the contact pad of the second electronic component. When the extension portion is pressed by the first electronic component in the thickness direction of the insulator, the extension portion is elastically bent at the one end thereof to further slant, so as to obtain a contact pressure against the contact pad of the first electronic component.

According to this invention, the first and the second leg portions extend from the supported portions thereof towards the bridge portion obliquely with respect to the thickness direction of the insulator. When the bridge portion is pressed by the second electronic component in the thickness direction of the insulator, the first and the second leg portions and the bridge portion are elastically deformed to cause the first and the second leg portions bent at the supported portions thereof to further slant, so that the bridge portion obtains a contact pressure against the contact pad of the second electronic component.

According to this invention, at least one of the first and the second leg portions has a predetermined-shaped portion formed at the supported portion thereof while the insulator has a mating portion to be engaged with the predetermined-shaped portion of the contact to prevent the contact from falling off out of the contact receptacle hole.

DESCRIPTION OF THE PREFERRED EMBODIMENT

Figure 1:
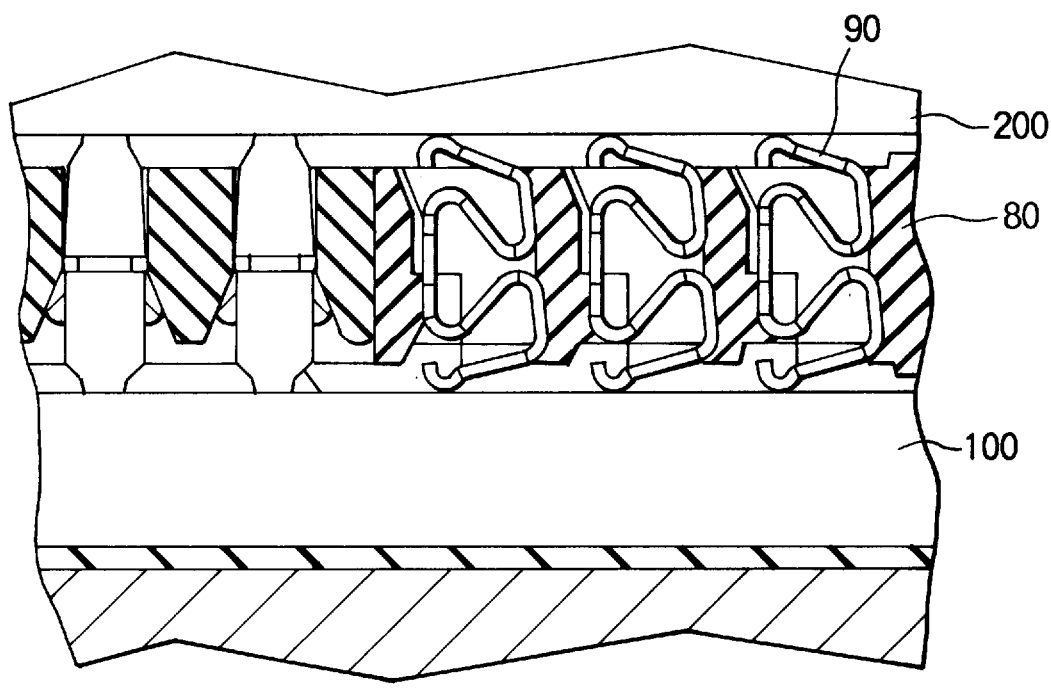
FIG. 1 is a sectional view of a main portion of a conventional connector.

In order to facilitate an understanding of this invention, description will at first be made about a conventional connector with reference to FIG. 1. The conventional connector comprises an insulator 80 having a predetermined thickness and provided with a plurality of contact receptacle holes penetrating the insulator 80 in a thickness direction, and a plurality of contacts 90 having an elasticity and inserted into and held in the contact receptacle holes, respectively. Each of the contacts 90 has a W shape. The connector is arranged, for example, between a printed board 100 and an LSI circuit 200. Then, the printed board 100 and the LSI circuit 200 are applied with a pressing force to clamp and press the insulator 80 therebetween. As a result, the printed board 100 and the LSI circuit 200 are electrically connected via the contacts 90.

In the conventional connector, an electrical connection between the printed circuit 100 and the LSI circuit 200 can be achieved through the connector by press contact of each of the contacts 90 of the connector with each of the contact pads of the printed board 100 and by press contact of each of the contacts 90 of the connector with each of the contact pads of the LSI circuit 200. In order to achieve reliable electrical connection, it is required to assure a sufficient contact pressure by the elasticity of the contacts 90. To acquire a sufficient elasticity of the contacts 90, the conventional connector uses the contacts 90 having a W shape which is long in length and complicated in shape.

However, the conventional connector using the W-shaped contacts has problems as described in the preamble.

Now, description will be made about this invention with reference to the drawing.

Generally speaking, a connector to which this invention is applicable is interposed between first and second electronic parts or components having contact pads, respectively, to achieve electrical connection between the first and the second electronic components. In the following description, the first and the second electronic components are a printed board and an LSI circuit, respectively. The connector comprises an insulator provided with a plurality of contact receptacle holes penetrating the insulator in a thickness direction, and a plurality of contacts having an elasticity and inserted into and held in the contact receptacle holes, respectively.

Figure 2A:
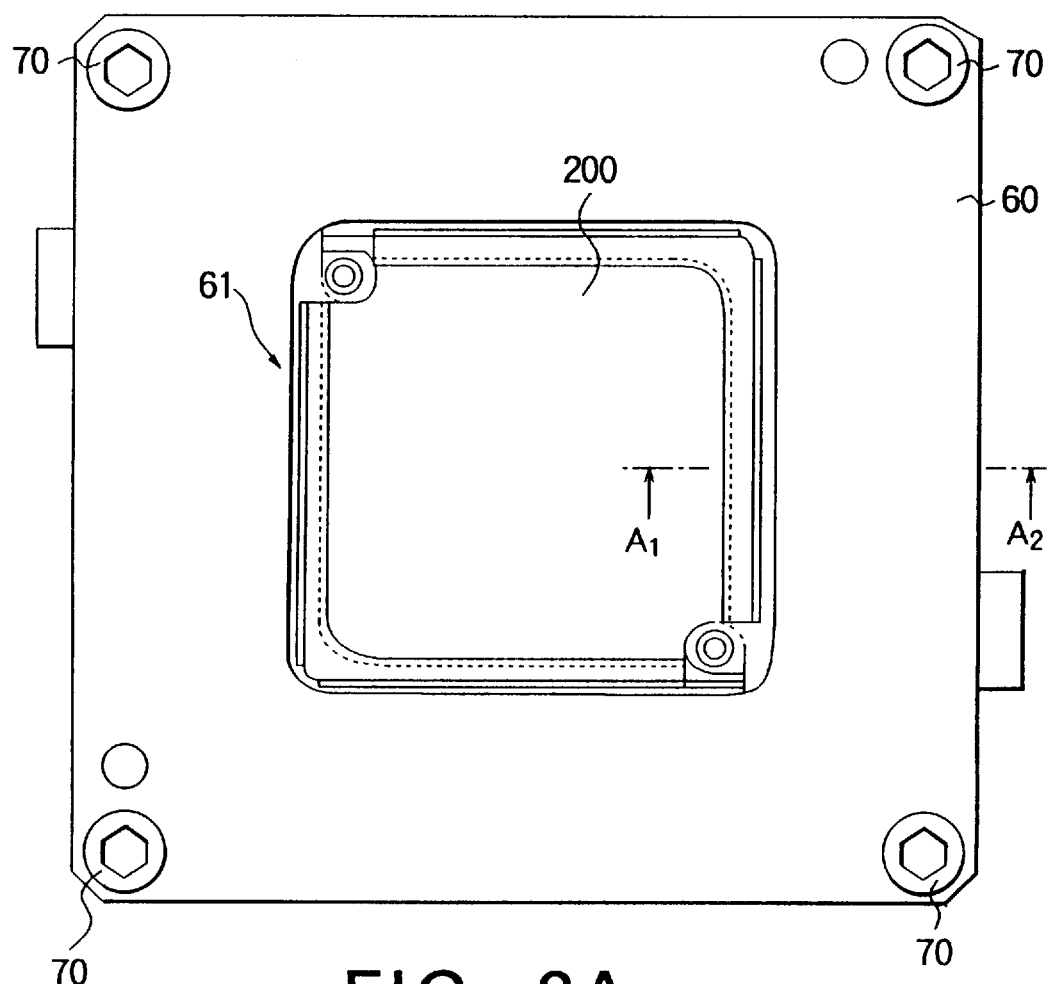
FIGS. 2A and 2B are a top view and a side view of a connector according to an embodiment of this invention, respectively.
Figure 2B:
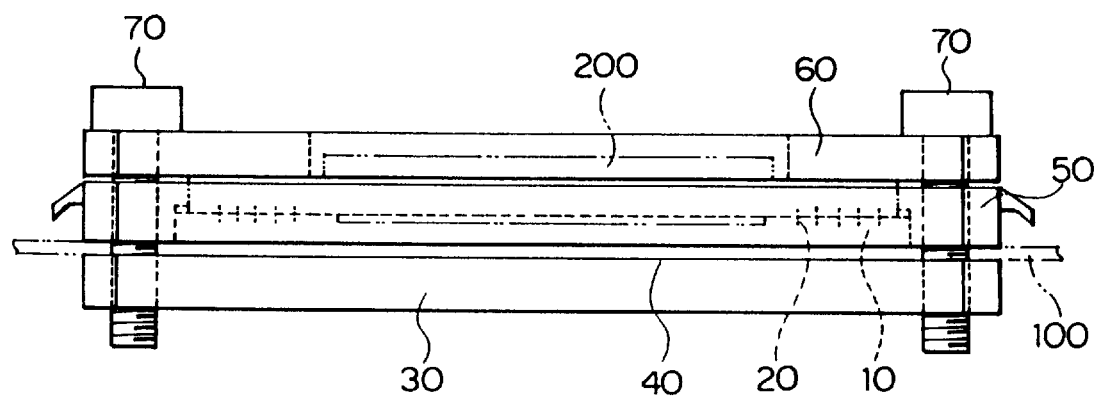
Figure 3:
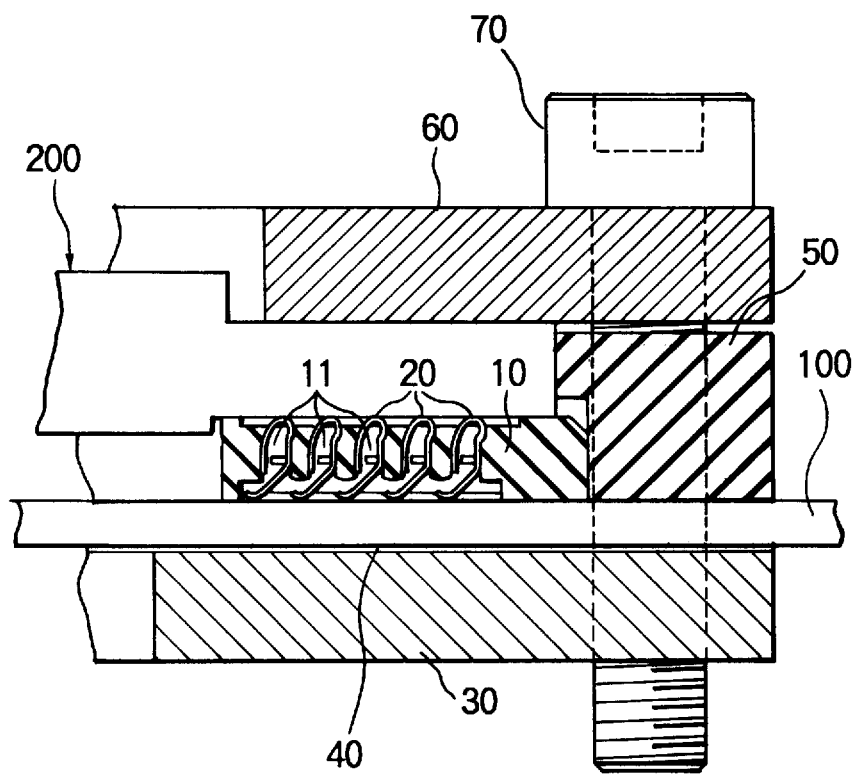
FIG. 3 is a sectional view taken along a line $A_1$–$A_2$ in FIG. 2A.

Referring to FIGS. 2A, 2B, and 3, a connector according to an embodiment of this invention comprises an insulator 10, a square metal plate 30 covered with an insulation film 40 and disposed below the insulator 10, an insulation frame 50 surrounding the insulator 10, a square cover 60 disposed on a top surface of the insulation frame 50, and four bolts 70 for clamping the metal plate 30, the insulation frame 50 and the square cover 60 together.

When the connector is mounted on a printed board 100, the insulator 10 is disposed on the printed board 100 and the metal plate 30 is disposed on the lower side of the printed board 100. The insulation film 40 is for insulating the printed board 100 from the metal plate 30. On the other hand, an LSI circuit 200 is mounted on the insulator 10 and is held by and between the cover 60 and the insulator 10. Thus, the insulator 10 is interposed between the printed board 100 and the LSI circuit 200.

The cover 60 has a square window 61 formed at its center for allowing a center portion projecting on an upper surface of the LSI circuit 200 to protrude upward when the center portion is large in height. The window 61 also insures the heat dissipation from the LSI circuit 200.

The four bolts 70 pass through those holes formed at four corners of the cover 60, the insulation frame 50, a region of the printed board 100, and the insulation film 40 and are screwed into threaded holes formed at four corners of the metal plate 30, respectively. Thus, the LSI circuit 200, the insulator 10, and the printed board 100 are clamped between the cover 60 and the metal plate 30.

Figure 4:
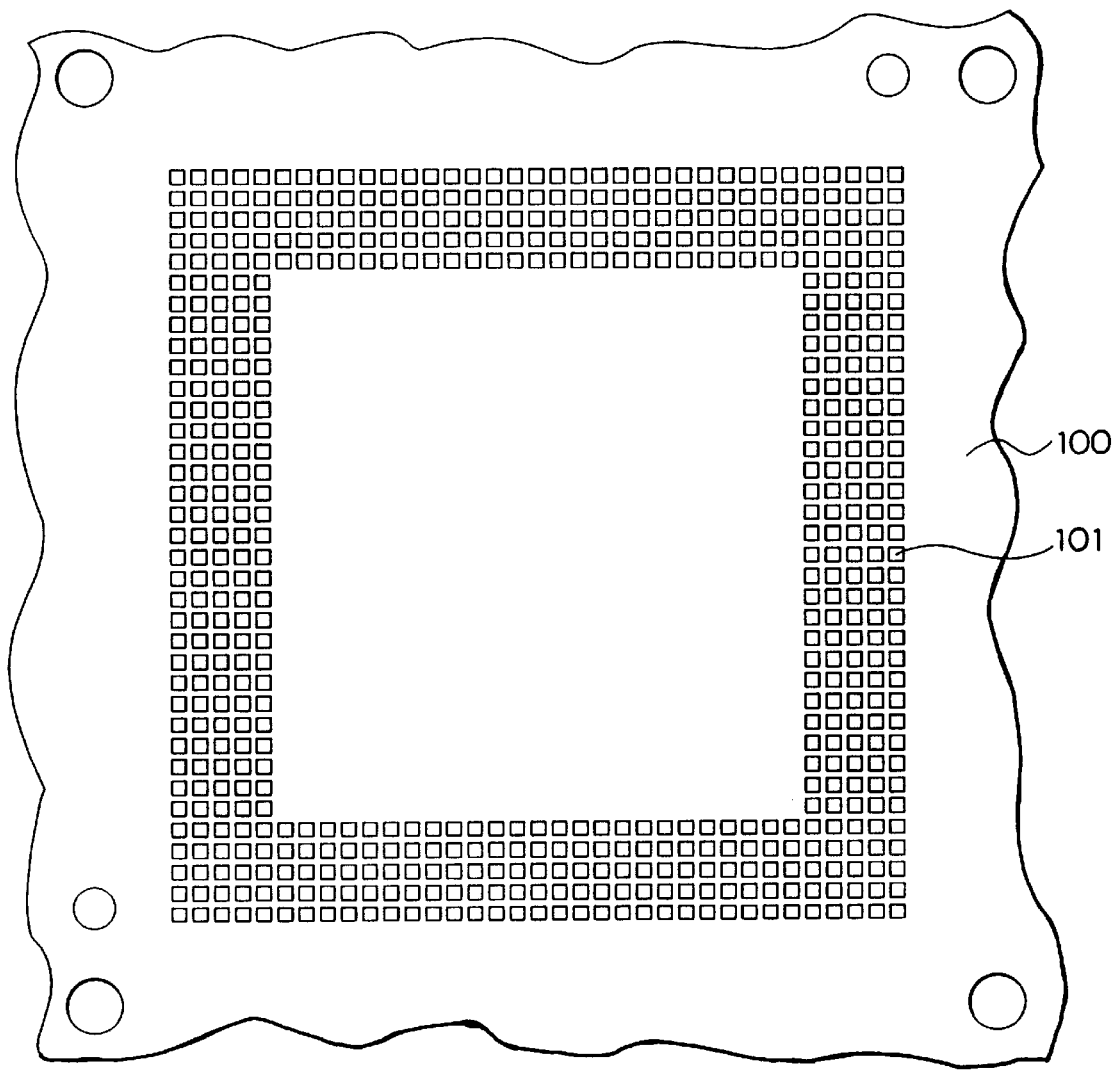
FIG. 4 is a top view of a portion of a printed board on which the connector of FIGS. 2A and 2B is mounted.

Referring to FIG. 3, the insulator 10 is clamped between the printed board 100 and the LSI circuit 200. As illustrated in FIG. 4, the printed board 100 has a plurality of contact pads 101 in an arrangement corresponding to contacts held in the insulator 10 and contact pads of the LSI circuit 200.

Figure 5:
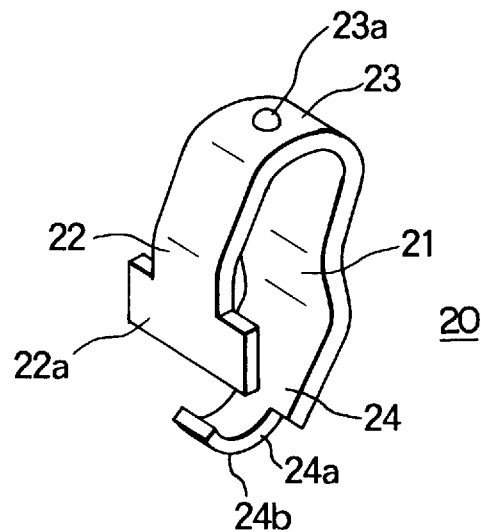
FIG. 5 is a perspective view of a contact illustrated in FIG. 3.
Figure 6:
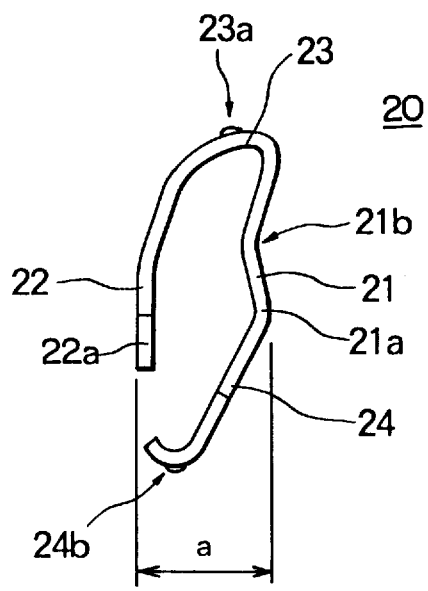
FIG. 6 is a side view of the contact illustrated in FIG. 5.

Referring to FIGS. 5 and 6, each contact 20 is formed by punching and bending an elastic metal plate so that each contact 20 comprises a generally U-shaped portion comprising a first leg portion 21, a second leg portion 22 and a bridge portion 23 connecting the first and the second leg portions 21 and 22, and an extension portion 24 from obliquely extending an end 21a (a lower end in the figures) of the first leg portion 21 downwardly. The first leg portion 21 has the lower end 21a and a bent depression 21b above and adjacent the lower end 21a. The second leg portion 22 has a widened end 22a (lower end in the figure). The extension portion 24 has a curved end portion 24a as an extended lower end portion and a first contact point 24b formed on the curved end portion 24a to be brought into contact with the contact pad of the printed board 100. The bridge portion 23 has a second contact point 23a on its top portion (as shown in the figures) to be brought into contact with the contact pad of the LSI circuit 200.

Figure 7:
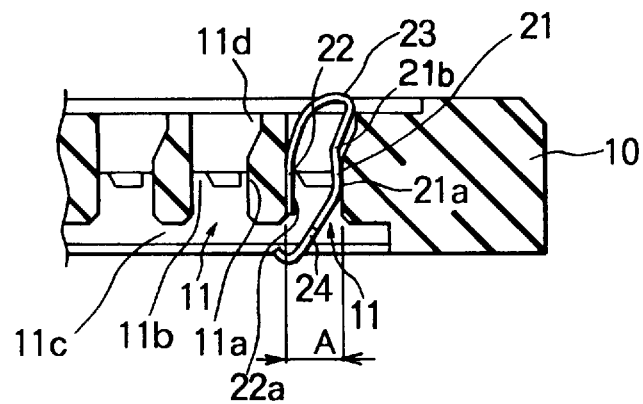
FIG. 7 is a sectional view for describing the contact fitted in the insulator taken along a sectional line.
Figure 8:
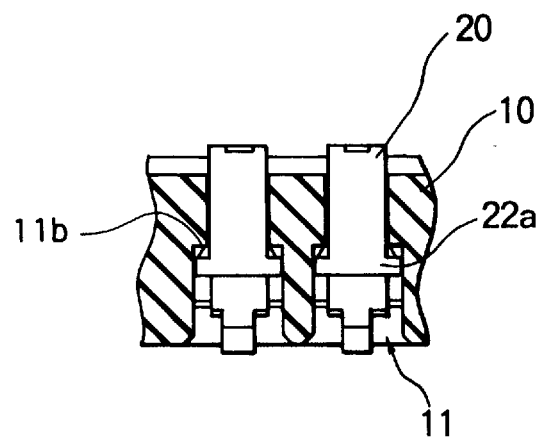
FIG. 8 is a sectional view for describing the contact fitted in the insulator taken along another line perpendicular to the sectional line of FIG. 7.

Referring to FIGS. 7 and 8, the contact 20 is inserted into each of the contact receptacle holes 11 of the insulator 10 and held at a predetermined position. For convenience of description, the contact 20 is inserted into only one of the three contact receptacle holes 11 in the figure. In this state, the first and the second leg portions 21 and 22 are held by an inner wall surface of the contact receptacle hole 11. Specifically, the end portion of the first leg portion 21 including the lower end 21a and the bent depression 21b and the end portion of the second leg portion 22 including the widened end 22a are respectively held by holding portions 11a and 11b each of which is a part of the inner wall surface defining the contact receptacle hole 11. The end portions of the first and the second leg portions 21 and 22 may be referred to as supported portions.

The holding effect of the contact by the wall surface is achieved because the contact 20 having a dimension a (FIG. 6) in a free state and having an elasticity is press-fitted into the contact receptacle hole 11 having a dimension A (FIG. 7) smaller than the dimension a. In addition, the holding portion 11a is inserted into the bent depression 21b, while the widened end 22a of a special shape is engaged with step portions at the holding portion 11b in the contact receptacle hole 11, as illustrated in FIG. 8. So that the contact 20 is difficult to escape from the contact receptacle hole 11 and is reliably held in the contact receptacle hole 11 of the insulator 10.

As seen from FIG. 7, the contact receptacle hole 11 of the insulator 10 has a cavity 11c and a depression 11d. The cavity 11c should be understood as a recess formed in a lower surface (as viewed in the figure) of the insulator 10 to allow elastic deformation (which will later be described) of the extension portion 24 of the contact 20 inserted into the contact receptacle hole 11. Likewise, the depression 11d should be understood as a recess formed in the inner wall of the contact receptacle hole 11 to allow elastic deformation (which will later be described) of the first and the second leg portions 21 and 22 together with the bridge portion 23 of the contact 20 inserted into the contact receptacle hole 11.

Figure 9A:
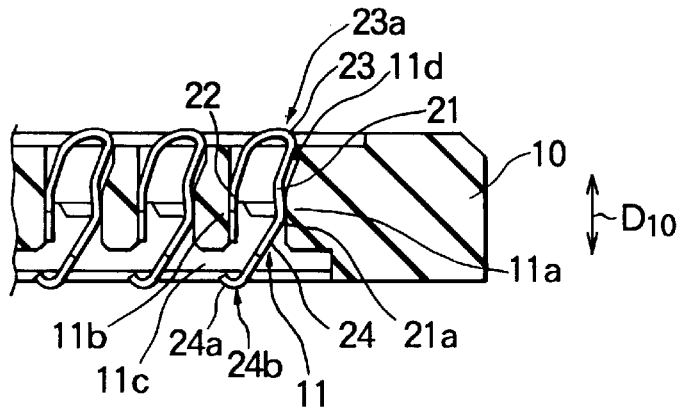
FIGS. 9A through 9C are sectional views for describing an operation of the connector.
Figure 9B:
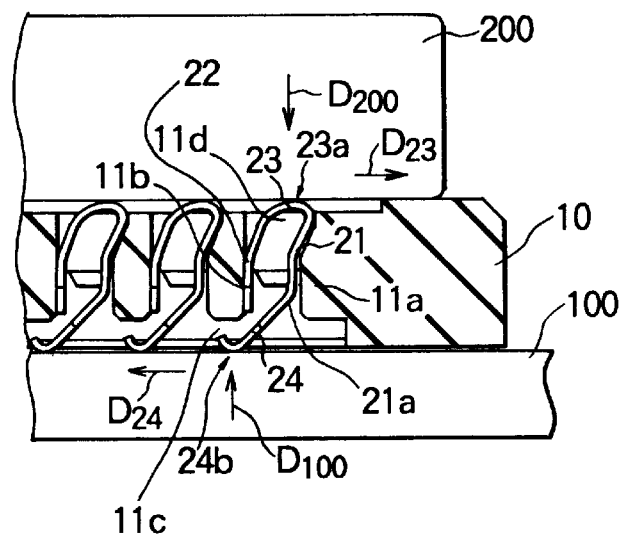
Figure 9C:
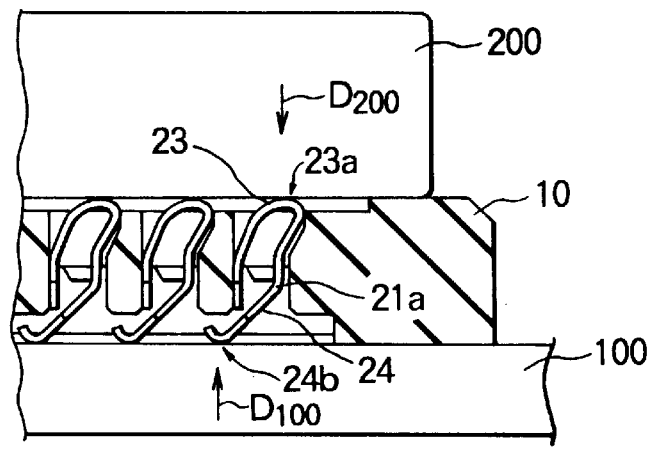

Referring to FIGS. 9A through 9C, an operation of the connector will be described. In these figures, only a relevant part of the connector is illustrated for simplicity of illustration.

Referring to FIG. 9A, the contacts 20 are inserted into and held in the contact receptacle holes 11 of the insulator 10, respectively, like in FIG. 7. In the illustrated state, the insulator 10 is not yet clamped by the printed board 100 and the LSI circuit 200 (not shown). The extension portion 24 of each contact 20 downwardly extends from the lower end 21a of the first leg portion 21 but is oblique (in this embodiment, leftwards in the figure) with respect to the thickness direction $D_{10}$ of the insulator 10. The first and the second leg portions 21 and 22 of the contact 20 obliquely (rightward in this embodiment) extend from the end portions held by the holding portions 11a and 11b towards the bridge portion 23 with respect to the thickness direction $D_{10}$. The first contact point 24b of the contact 20 protrudes from a lower surface of the insulator 10. On the other hand, the second contact point 23a protrudes from an upper surface of the insulator 10. Thus, the curved portion 24a having the first contact point 24b is located below the cavity 11c. While, the first and the second leg portions 21 and 22 and the bridge portion 23 are located at the left side of the depression 11d.

Referring to FIG. 9B, when the connector with LSI circuit 200 contained therein is mounted on the printed board 100 and is clamped by screwing the bolts (70 in FIGS. 2B and 3), the curved potion 24a of the extension portion 24 is brought into contact with the printed board 100 and is therefore pressed by the printed board 100 in a direction depicted by an arrow $D_{100}$. In FIG. 9B, the insulator 10 is illustrated between the printed board 100 and the LSI circuit 200 in the middle of a clamping operation. In other words, the insulator 10 is incompletely clamped between the printed board 100 and the LSI circuit 200. Therefore, the extension portion 24 is bent at the lower end 21a of the first leg portion 21 in a clockwise direction about the lower end 21a. As a result, the extension portion 24 gains a contact pressure against the contact pad (101 in FIG. 4) of the printed board 100. Thus, the curved end portion 24a of the extension portion 24 is moved not only in the direction of the arrow $D_{100}$ but also in a direction parallel to a board surface of the printed board 100 as depicted by an arrow $D_{24}$. Therefore, the first contact point 24b frictionally slides on the surface of the contact pad 101 of the printed board 100. Thus, the contamination and/or metal oxide film is wiped out from the contact pad 101 of the printed board 100 and the first contact point 24b.

On the other hand, the bridge portion 23 is pressed by the LSI circuit 200 in a direction depicted by an arrow $D_{200}$. As a result, the first and the second leg portions 21 and 22 and the bridge portion 23 are elastically deformed. Specifically, the first and the second leg portions 21 and 22 slant in the direction towards the depression 11d, namely, in a clockwise direction about the supported portions held by the holding portions 11a and 11b, respectively. As a result, the bridge portion 23 gains a contact pressure against the contact pad (not shown) of the LSI circuit 200. Further, the second contact point 23a of the bridge portion 23 is moved not only in the direction of the arrow $D_{200}$ but also in a direction parallel to a board surface of the LSI circuit 200 as depicted by an arrow $D_{23}$. Therefore, the second contact point 23a frictionally slides on the surface of the contact pad of the LSI circuit. Thus, the contamination and/or metal oxide film is wiped out from the contact pad of the LSI circuit 200 and the second contact point 23a.

Referring to FIG. 9C, when the insulator 10 is completely clamped between the printed board 100 and the LSI circuit 200 as shown therein by further screwing the bolts 70, frictional sliding of the first contact point 24b and the second contact point 23a on the contact pad of the printed board 100 and the contact pad of the LSI circuit 200 is completed. Simultaneously, reliable electrical connection is achieved between the contact pad of the printed board 100 and the first contact point 24b and between the contact pad of the LSI circuit 200 and the second contact point 23a.

The frictional sliding is also carried out when the clamping force by the printed board 100 and the LSI circuit 200 is released and the contact 20 is returned to its initial position. Therefore, the wiping of contamination and/or metal oxide film is also effected at the release of the clamping force.

As described above, the contact is simple in the structure but provides a relatively large contact pressure between the contact points and the contact pads. Therefore, the contact is reliably brought into tight contact with the contact pad of the electronic component. In addition, the wiping operation is sufficiently wide.

Since the contact has such a simple structure, the signal path between the first and the second contact points is slightly larger than the thickness of the insulator 10. Therefore, the connector is excellent in high-frequency characteristic. In addition, the contact of a simple structure and a short length is low in production cost and easy in fitting the contact into the insulator.

What is claimed is:

1. An electrical connector for making an electrical connection between first and second electronic components having contact pads, said connector comprising an insulator having a predetermined thickness and being provided with a plurality of contact receptacle holes penetrating said insulator in a thickness direction, and a plurality of contacts having an elasticity and being inserted into and held in said contact receptacle holes, respectively, wherein:

Each of said contacts comprises first and second leg portions, a bridge portion connecting said first and said second leg portions and being form in a generally U-shaped section in combination with said first and said second leg portions, and an extension portion having one end connected to a first leg end of said first leg portion and obliquely extending from the one end towards the opposite and free end;

said first and said second leg portions having first and second end portions which are supported portions held by an inner wall surface of an individually associated one of said contact receptacle holes, respectively;

said extension portion having a first contact point formed at an opposite and free end to be brought into contact with said contact pad of the first electronic component;

said bridge portion having a second contact point to be brought into contact with said contact pad of the second electronic component;

said extension portion being elastically bent at, and rotated about, said one end thereof to further slant when said extension portion is pressed by said first electronic component in the thickness direction of said insulator, said pressing by said first electronic component creating a contact pressure against said contact pad of the first electronic component, said contact pressure being applied to cause said first contact point to frictionally slide over and wipe a surface of said contact pad of the first electronic component.

2. A connector as claimed in claim 1, wherein:

said first and said second leg portions extend from said supported portions thereof towards said bridge portion, said leg portions extending obliquely with respect to the thickness direction of said insulator;

said first and said second leg portions and said bridge portion being elastically deformed to cause said first and said second leg portions bent at said supported portions thereof to further slant when said bridge portion is pressed by said second electronic component in the thickness direction of said insulator, said deformation and slanting of said bridge portion applying a contact pressure against said contact pad of the second electronic component, while said second contact point is laterally deflected to slide with friction and to wipe a surface of said contact pad of the second electronic component.

3. A connector as claimed in claim 1, wherein at least one of said first and said second leg portions has a predetermined-shaped portion formed at said supported portion thereof while said insulator has a mating portion to be engaged with said predetermined-shaped portion of the contact to prevent the contact from falling off out of said contact receptacle hole.

* * * * *